(12) United States Patent
Sawdai et al.

(10) Patent No.: US 6,784,514 B2
(45) Date of Patent: Aug. 31, 2004

(54) LOW LEAKAGE SCHOTTKY DIODE

(75) Inventors: Donald J. Sawdai, Redondo Beach, CA (US); Augusto L. Gutierrez-Aitken, Redondo Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/684,910

(22) Filed: Oct. 14, 2003

(65) Prior Publication Data

US 2004/0075114 A1 Apr. 22, 2004

Related U.S. Application Data

(63) Continuation of application No. 09/658,222, filed on Sep. 8, 2000, now Pat. No. 6,653,707.

(51) Int. Cl.[7] .................. H01L 27/095; H01L 29/47; H01L 29/812; H01L 31/07; H01L 31/108
(52) U.S. Cl. .................. 257/472; 257/473; 257/449
(58) Field of Search ................. 257/472, 473, 257/449

(56) References Cited

U.S. PATENT DOCUMENTS

| | | |
|---|---|---|
| 3,746,950 A | 7/1973 | Kano et al. |
| 4,859,616 A | 8/1989 | Losehand et al. |
| 4,862,229 A * | 8/1989 | Mundy et al. ............... 257/484 |
| 5,055,890 A | 10/1991 | Dawson et al. |
| 6,087,704 A * | 7/2000 | Chang et al. ................ 257/472 |

OTHER PUBLICATIONS

Physics of Semiconductor Devices, $2^{nd}$ Edition, by S.M. Sze; John Wiley & Sons, N.Y,. 1981, pp. 282–311.
Controlled Formation of High Schottky Barriers on InP and Related Materials, by Hideki Hasegawa; May 11–15, 1998 IEEE.
Nearly Ideal Schottky Contacts of n–InP by Z.Q. Shi and W.A. Anderson, State University of New York at Buffalo, IPRM 1991.
Schottky contacts to InP, InGaAs and InAlAs, by S. Wilks, L. Jenkins, J. Morris, S. Clark and R.H. Williams, University of Wales College of Cardiff, IPRM 1991.

* cited by examiner

*Primary Examiner*—David Nelms
*Assistant Examiner*—Tu-Tu Ho
(74) *Attorney, Agent, or Firm*—Posz & Bethards, PLC

(57) ABSTRACT

A preferred embodiment of the present invention provides a Schottky diode formed from a conductive anode contact, a semiconductor junction layer supporting the conductive contact and a base layer ring formed around at least a portion of the conductive anode contact. In particular, the base layer ring has material removed to form layer material gap (e.g., a vacuum gap) adjacent to the conductive anode contact. A dielectric layer is also provided to form one boundary of the base layer material gap.

9 Claims, 4 Drawing Sheets

Figur 3

LOW LEAKAGE SCHOTTKY DIODE

RELATED APPLICATIONS

This file is a continuation of application Ser. No. 09/658,222 filed on Sep. 8, 2000 now U.S. Pat. No. 6,653,707.

MICROFICHE/COPYRIGHT REFERENCE

[Not Applicable]

FEDERALLY SPONSORED RESEARCH OR DEVELOPMENT

This invention was made with Government support under Sales Number 67913 with the U.S. Air Force. The Government has certain rights to this invention.

BACKGROUND OF THE INVENTION

The present invention relates to semiconductor diodes. In particular, the present invention relates to a Schottky diode with reduced reverse leakage current.

Diodes are a fundamental electronic building block. Their ability to restrict current flow to substantially one direction is a critical property relied upon in virtually every electronic circuit manufactured, from the smallest power supply to the largest industrial process controller. While unidirectional current flow is an ideal diode property, all diodes are subject to undesirable reverse leakage current.

The reverse leakage current is current that flows "backwards" through a reverse biased diode (i.e., when the diode should ideally be off or completely nonconducting). In other words, even when the diode is reversed biased, the diode allows a small amount of current (the reverse leakage current) to flow.

In most instances, the reverse leakage current is detrimental to system performance. As one example, in a sampling analog to digital converter, the reverse leakage current may result in charge allowed to dissipate off of a holding capacitor. As a result, the digital conversion process has a limited amount of time in which to complete a suitably accurate conversion. The longer the conversion delay, the less accurate the final result, as reverse leakage current continues to remove charge from the holding capacitor. Generally, the reverse leakage current results in undesired power dissipation to no useful end.

Because a portion of the reverse leakage current arises from the physical junction interaction the Schottky metal and semiconductor materials (in a Schotttky diode) or the p and n semiconductor materials (in a pn diode), a certain amount of reverse leakage current is unavoidable. However, experiments show that the particular arrangement or layout of the semiconductor materials that form the diode also can also contribute to the leakage current. Regardless of its source, the reverse leakage current in virtually instance introduces undesirable characteristics in the operation of an efficient device.

A need has long existed in the industry for a diode that addresses the problems noted above and others previously experienced.

BRIEF SUMMARY OF THE INVENTION

A preferred embodiment of the present invention provides a Schottky diode formed from a conductive anode contact, a semiconductor junction layer supporting the conductive contact and a base layer ring formed around at least a portion of the conductive anode contact. In particular, the base layer ring has material removed to form a base layer material gap (e.g., a vacuum gap) adjacent to the conductive anode contact. A dielectric layer is also provided to form one boundary of the base layer material gap. The conductive contact may be, as examples, a layer of Titanium, a layer of Platinum, and a layer of Gold, or a layer of Platinum, a layer of Titanium, a second layer of Platinum, and a layer of Gold.

The base layer material gap is preferably sized in accordance with the expected extent of a reverse bias depletion region in the semiconductor layer. In other words the base layer material gap is generally large enough to present an absence of base layer material to the depletion region above the semiconductor layer.

Another preferred embodiment of the present invention provides a method for fabricating a diode. The method includes the steps of creating a semiconductor layer on a substrate, creating a base layer on the semiconductor layer, and creating a dielectric layer on the base layer. In addition, the method removes a portion of the dielectric layer to form a via through the dielectric layer to the base layer, laterally removes a portion of the base layer underneath the dielectric layer and through to the semiconductor layer at the via, and creates a conductive anode contact in the via supported by the semiconductor layer. The conductive anode contact thereby bounds a base layer gap between the conductive anode contact and the base layer ring.

DETAILED DESCRIPTION OF THE INVENTION

Figure 1:
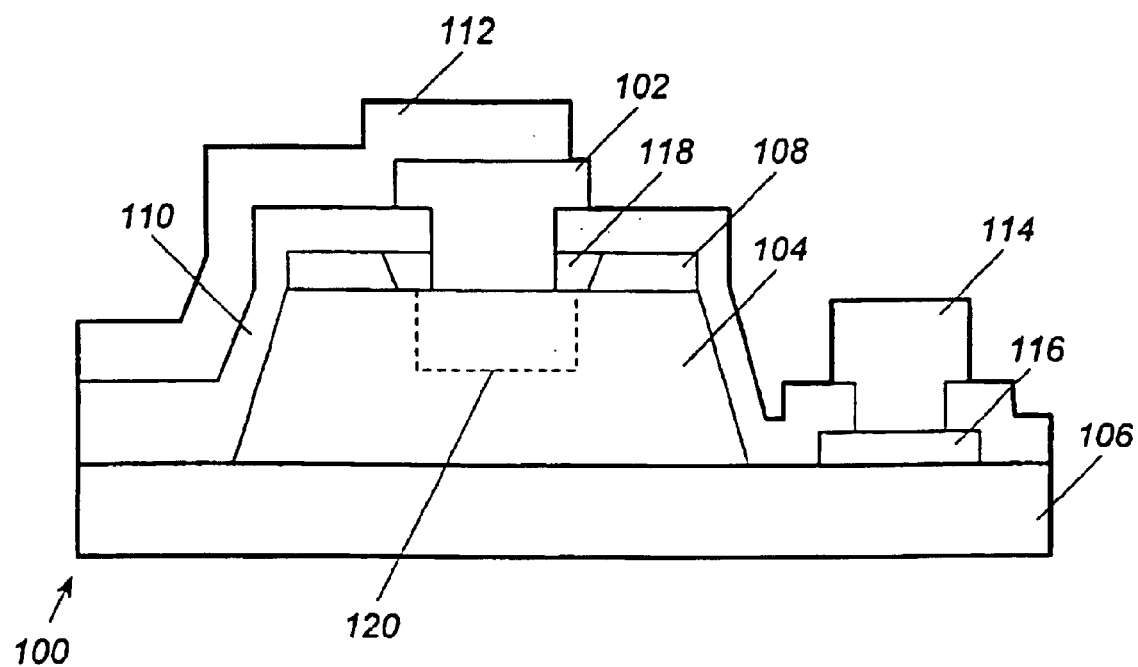
FIG. 1 shows a cross section of a Schottky diode.

Turning now to FIG. 1, that figure presents a cross section of a Schottky diode 100. The diode 100 includes a conductive anode 102 supported by a semiconductor layer 104 and a substrate 106. In addition, a base layer ring 108 is present on the semiconductor layer 104 around the conductive anode contact 102. A dielectric layer 110 provides isolation where required between the structure of the diode 100 and, for example, the metal interconnect trace 112. A cathode contact is also provided by a metal interconnect 114 through an n doped ohmic contact 116 (e.g., layered Gold, Germanium, Nickel, and additional Gold) to the substrate 106. Material is removed from the base layer ring 108 near around the conductive anode contact 102 to form a base layer material gap 118 (e.g., a vacuum gap) that extends over a predetermined portion of an expected reverse bias depletion region 120 (at a preselected voltage).

As examples, the substrate 106 may be an n+ Indium Phosphide (InP) layer grown on a wafer, the semiconductor layer 104 may be a grown epitaxial n– InP layer, etched to form the desired shape for supporting the conductive anode contact 102. The dielectric layer 110 may be Silicon Nitride (SiN). The base layer ring 108 (which prevents the dielectric layer 110 from contacting the semiconductor layer 104 near the conductive anode contact 102) is preferably a different material than either the dielectric layer 110 or the semiconductor layer 104 in order to allow selective etching of the base layer ring 108. To that end, the base layer ring 108 may be p doped Indium-Gallium-Arsenide (InGaAs). The polarities of all the semiconductor materials may be reversed however.

The conductive anode contact 102 may be vacuum deposited metal. Preferably, the conductive anode contact 102 is formed as several layers of different metals. Specifically, the conductive anode contact 102 may include a layer of Titanium (in direct contact with the semiconductor layer 104) that supports a layer of Platinum, that in turn supports a thick layer of Gold. Preferably, when the semiconductor layer 104 is InP, the conductive anode contact 102 includes a first layer of Platinum (in direct contact with the semiconductor layer 104), followed by a layer of Titanium, followed by a layer of Platinum, followed by a layer of Gold. The size of the diode 100 may vary substantially and the conductive anode contact 102 interface with the semiconductor layer 104 may be formed, as examples, using a 3×3 micron or a 9×9 micron square.

Experiments suggest that dielectric layer 110 contact with the semiconductor layer 104 near the conductive anode contact 102 causes a pinch-in effect of the depletion region near the conductive anode contact 102. As a result, an effective short circuit or conductive path forms near the edges of the conductive anode contact 102 that allows additional reverse leakage current to flow. The base layer material gap 118 may be formed (as described below) using a wet etching process to laterally remove base layer material underneath the dielectric layer 110, and down through to the semiconductor layer 104.

The fabrication process for the diode 100 generally leads to the base layer material gap 118 formed as a vacuum gap. The base layer material gap 118 in general, however, indicates removal of the base layer ring material itself. In other words, instead of a vacuum gap, other materials or surface treatments that achieve the same beneficial reduction in reverse leakage current may replace the base layer material in the gap area.

The base layer material gap 118 is generally sized in accordance with the expected lateral extent of the reverse bias depletion region 120 in the semiconductor layer 104, at a chosen voltage. Preferably, the base layer material gap 118 extends over the entire depletion region 120. The base layer material gap 118 may, however, extend over a smaller portion of the reverse bias depletion region 120, with larger base layer material gaps providing larger reductions in reverse leakage current until the base layer material gap 118 extends beyond the full lateral extent of the reverse bias depletion region 120.

Three characteristics of the diode 100 are apparent from FIG. 1. First, conductive anode contact 102 touches the semiconductor layer 104, but not the base layer ring 108. Second, the dielectric layer 110 does not contact the semiconductor layer 104 near (i.e., in the region of the depletion region 120) the conductive anode contact 102. Third, the diode 100 is fully sealed in that the semiconductor materials forming the diode 100 are covered or fully surrounded by metal or dielectric layers.

Figure 2:
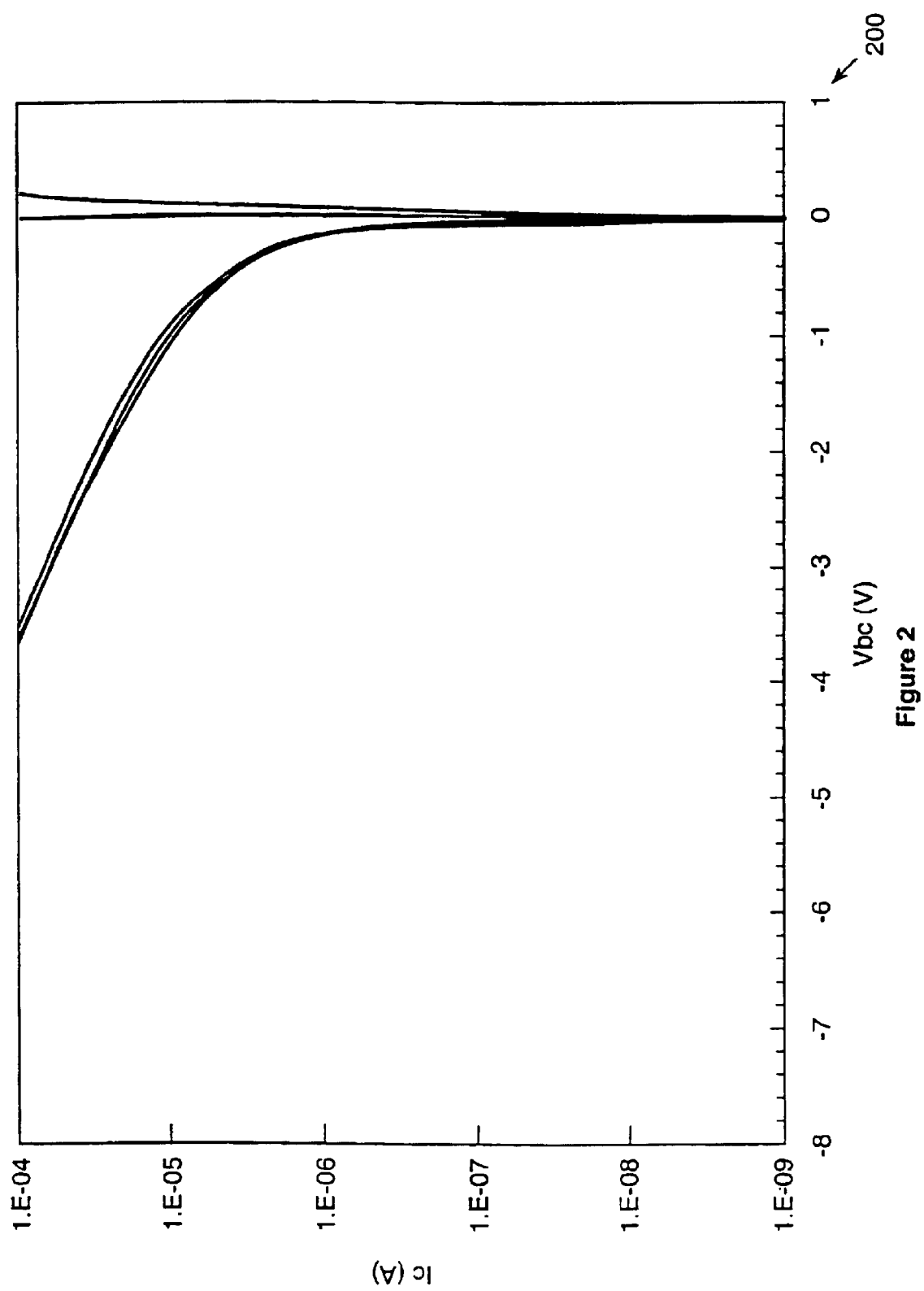
FIG. 2 shows a plot including reverse leakage current in a prior art diode.
Figure 3:
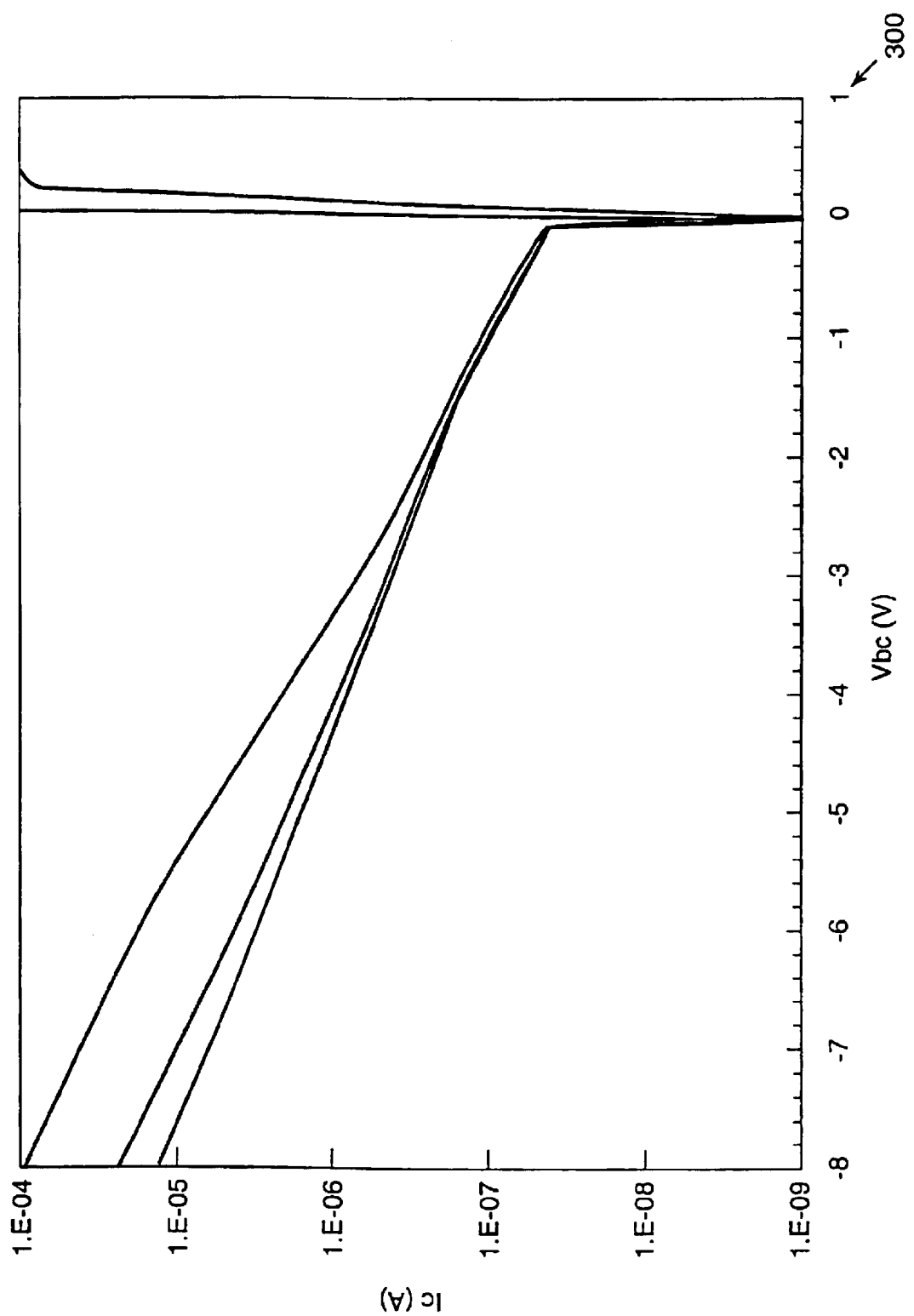
FIG. 3 shows a plot including reverse leakage current in the present diode.

Turning now to FIGS. 2 and 3, FIG. 2 illustrates plots 200 including reverse leakage current through a prior art diode for three different wafers, while FIG. 3 shows plots 300 including reverse leakage current through the diode 100 for three different wafers. Taking a reverse bias voltage of −1 voltage, for example, the corresponding reverse leakage current in the prior device was approximately 10 microamps. In the diode 100, however, the corresponding reverse leakage current is approximately 100 nanoamps (a 100-fold improvement). As another point of reference, at −3 volts, the reverse leakage current in the prior device was approximately 80 microamps. In the diode 100, the corresponding reverse leakage current is approximately 800 nanoamps.

Figure 4:
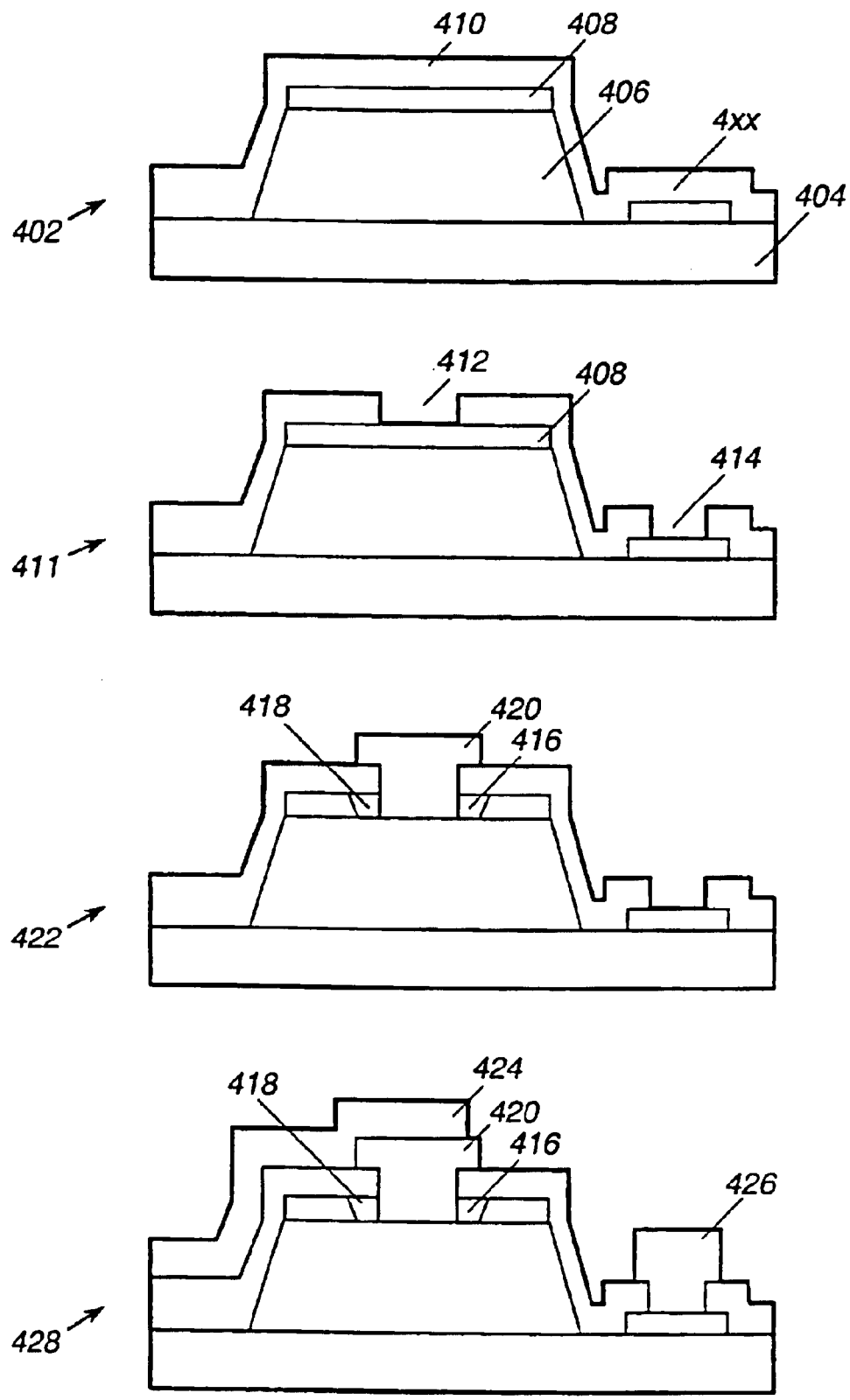
FIG. 4 shows a method for fabricating a Schottky diode.

Turning now to FIG. 4, that figure presents a method for fabricating the diode 100. The first step illustrated shows a starting cross section 402 that results from growing on an InP wafer the n+ InP substrate 404, growing the n− InP semiconductor layer 406, growing the p base layer ring 408, and etching them to desired shape, depositing the N ohmic contact 4xx, and depositing the SiN dielectric layer 410.

The result of the next fabrication steps is shown in the cross section 411. The next fabrication steps include applying a photoresist to selected regions of the dielectric layer 410, then etching to form the anode via 412 to the base layer ring 408, and the cathode via 414 to the N ohmic cathode contact 4xx.

Subsequently, the fabrication method laterally etches the base layer ring to form the base layer material gaps 416, 418 (which are part of a single base layer gap surrounding a conducting anode contact 420). The conducting anode contact 420 is formed after the lateral etching for example, by vacuum deposition. The conducting anode contact 420 thereby seals the base layer material gaps 416, 418 to form a vacuum gap bounded by the conducting anode contact 420, base layer ring 408, semiconductor layer 406, and dielectric layer 410. The lateral etching of the base layer ring 408 and the deposition of the conducting anode contact 420 may use a single shared photoresist pattern to minimize contamination of the surface of the semiconductor layer 406. The cross section 422 illustrates the base layer material gaps 416, 418, and the deposited conducting anode contact 420.

After depositing the conducting anode contact 420, the fabrication method may then deposit interconnecting metal. For example, the fabrication method may deposit the anode metal connection 424 to the conducting anode contact 420, as well as the cathode metal connection 426. The anode metal connection 424 and cathode metal connection 426 are illustrated in the cross section 428.

In an alternative method for fabricating the diode 100, instead of depositing the full conductive anode contact 420, only a thin metal layer is first deposited. The thin metal layer need not seal the base layer material gaps 416 and 418. Instead, additional dielectric is deposited to seal the base layer material gaps 416 and 418. Subsequently, the additional dielectric is etched away above the thin metal layer to allow access to the thin metal layer. Additional conductive anode contact metal is then deposited to connect to the thin metal layer, and the final interconnection metal may be deposited.

While the invention has been described with reference to a preferred embodiment, those skilled in the art will understand that various changes may be made and equivalents may be substituted without departing from the scope of the invention. In addition, many modifications may be made to adapt a particular step, structure, or material to the teachings of the invention without departing from its scope. Therefore, it is intended that the invention not be limited to the particular embodiment disclosed, but that the invention will include all embodiments falling within the scope of the appended claims.

What is claimed is:

1. A method for creating a semiconductor device, said method including:

forming a base layer on a semiconductor layer, said base layer having different electrical properties from said semiconductor layer;

forming a dielectric layer on said base layer, said base layer having different electrical properties from said dielectric layer;

establishing an opening in said base layer and an opening in said dielectric layer to expose said semiconductor layer, wherein the lateral extent of said opening in said base layer is greater than the lateral extent of said opening in said dielectric layer; and positioning a conductive contact in said opening in said base layer and said opening in said dielectric layer, said conductive contact forming a contact between said conductive contact and said semiconductor layer, wherein the lateral extent of said contact is less than the lateral extent of said opening in said base layer.

2. The method of claim 1, wherein said base layer has a different chemical composition than said dielectric layer and said semiconductor layer.

3. The method of claim 1, wherein said base layer may be selectively etched relative to said dielectric layer.

4. The method of claim 1, wherein said base layer may be selectively etched relative to said semiconductor layer.

5. The method of claim 1, wherein said step of establishing said opening in said base layer occurs by laterally etching said base layer relative to the surface of said semiconductor layer.

6. The method of claim 1, wherein said semiconductor layer includes a depletion region when a voltage bias is applied to said semiconductor device, wherein the lateral extent of said opening in said base layer is at least as large as the lateral extent of said depletion region.

7. A method for reducing reverse leakage current in a semiconductor device, said method including:

establishing a semiconductor structure including a semiconductor substrate, a first layer on top of said substrate and a second layer on top of said first layer;

establishing a first layer opening in said first layer;

establishing a second layer opening in said second layer, wherein said first layer has different electrical properties than said second layer and said semiconductor layer, wherein the area of said second layer opening overlaps at least a portion of the area of said first layer opening to expose said semiconductor layer; and positioning a conductive contact in contact with said semiconductor layer and situated in said first layer opening and said second layer opening, wherein said conductive contact does not contact said first layer.

8. The method of claim 7, wherein said first layer has a different chemical composition than said second layer.

9. The method of claim 7, wherein said first layer may be selectively etched relative to said second layer.

* * * * *